United States Patent
Mittal et al.

(10) Patent No.: US 9,660,585 B2
(45) Date of Patent: May 23, 2017

(54) CLASS AB AMPLIFIER

(71) Applicant: QUALCOMM Incorporated, San Diego, CA (US)

(72) Inventors: Ayush Mittal, Bangalore (IN); Gireesh Rajendran, Bangalore (IN); Rahul Karmaker, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/742,351

(22) Filed: Jun. 17, 2015

(65) Prior Publication Data

US 2016/0373062 A1    Dec. 22, 2016

(51) Int. Cl.
| | |
|---|---|
| *H03F 1/02* | (2006.01) |
| *H03F 3/21* | (2006.01) |
| *H03F 3/19* | (2006.01) |
| *H03F 3/45* | (2006.01) |
| *H03F 3/24* | (2006.01) |
| *H03F 3/30* | (2006.01) |

(52) U.S. Cl.
CPC .......... *H03F 1/0205* (2013.01); *H03F 3/19* (2013.01); *H03F 3/211* (2013.01); *H03F 3/245* (2013.01); *H03F 3/3022* (2013.01); *H03F 3/45192* (2013.01); *H03F 3/45219* (2013.01); *H03F 3/45654* (2013.01); *H03F 2200/294* (2013.01); *H03F 2200/451* (2013.01); *H03F 2203/21106* (2013.01); *H03F 2203/30015* (2013.01); *H03F 2203/45008* (2013.01); *H03F 2203/45134* (2013.01)

(58) Field of Classification Search
USPC .................................................. 330/252–261
See application file for complete search history.

(56) References Cited

U.S. PATENT DOCUMENTS

| | | | |
|---|---|---|---|
| 5,006,817 A | 4/1991 | Babanezhad | |
| 5,703,532 A | 12/1997 | Shin et al. | |
| 7,176,760 B2 | 2/2007 | Jones | |
| 7,342,418 B2 * | 3/2008 | Moon ............ | H03K 19/018521 |
| | | | 326/83 |
| 7,375,585 B2 * | 5/2008 | Trifonov ............. | H03F 3/45219 |
| | | | 330/258 |
| 7,639,078 B2 | 12/2009 | Rayanakorn et al. | |

(Continued)

FOREIGN PATENT DOCUMENTS

WO    WO-2011047352    4/2011

OTHER PUBLICATIONS

International Search Report and Written Opinion—PCT/US2016/031912—ISA/EPO—Jul. 29, 2016.

*Primary Examiner* — Hieu Nguyen
(74) *Attorney, Agent, or Firm* — Paradice and Li LLP

(57) ABSTRACT

A class AB amplifier may include an input stage, a first folded cascode stage, a second folded cascode stage, and a class AB output stage. In some embodiments, the class AB output stage may provide differential output signals. The common-mode voltage of the differential output signals may be controlled via a correction signal coupled to a selected folded cascode stage. The correction signal may control the common-mode voltage of the differential output signals by altering bias currents within the selected folded cascode stage. The other cascode stage may include bias currents controlled by relatively fixed bias voltages.

12 Claims, 13 Drawing Sheets

(56) References Cited

U.S. PATENT DOCUMENTS

| | | |
|---|---|---|
| 7,746,170 B2 | 6/2010 | Amini et al. |
| 7,786,801 B2 | 8/2010 | Kim |
| 7,872,531 B1 | 1/2011 | Dhanasekaran |
| 7,884,671 B2 * | 2/2011 | Chung .................... H03F 3/301 330/255 |
| 7,994,859 B2 | 8/2011 | Sutardja |
| 8,536,947 B2 | 9/2013 | Wang et al. |
| 2013/0249635 A1 | 9/2013 | Kim et al. |
| 2014/0197888 A1 | 7/2014 | Rajaee |
| 2015/0022266 A1 | 1/2015 | Rajaee |

* cited by examiner

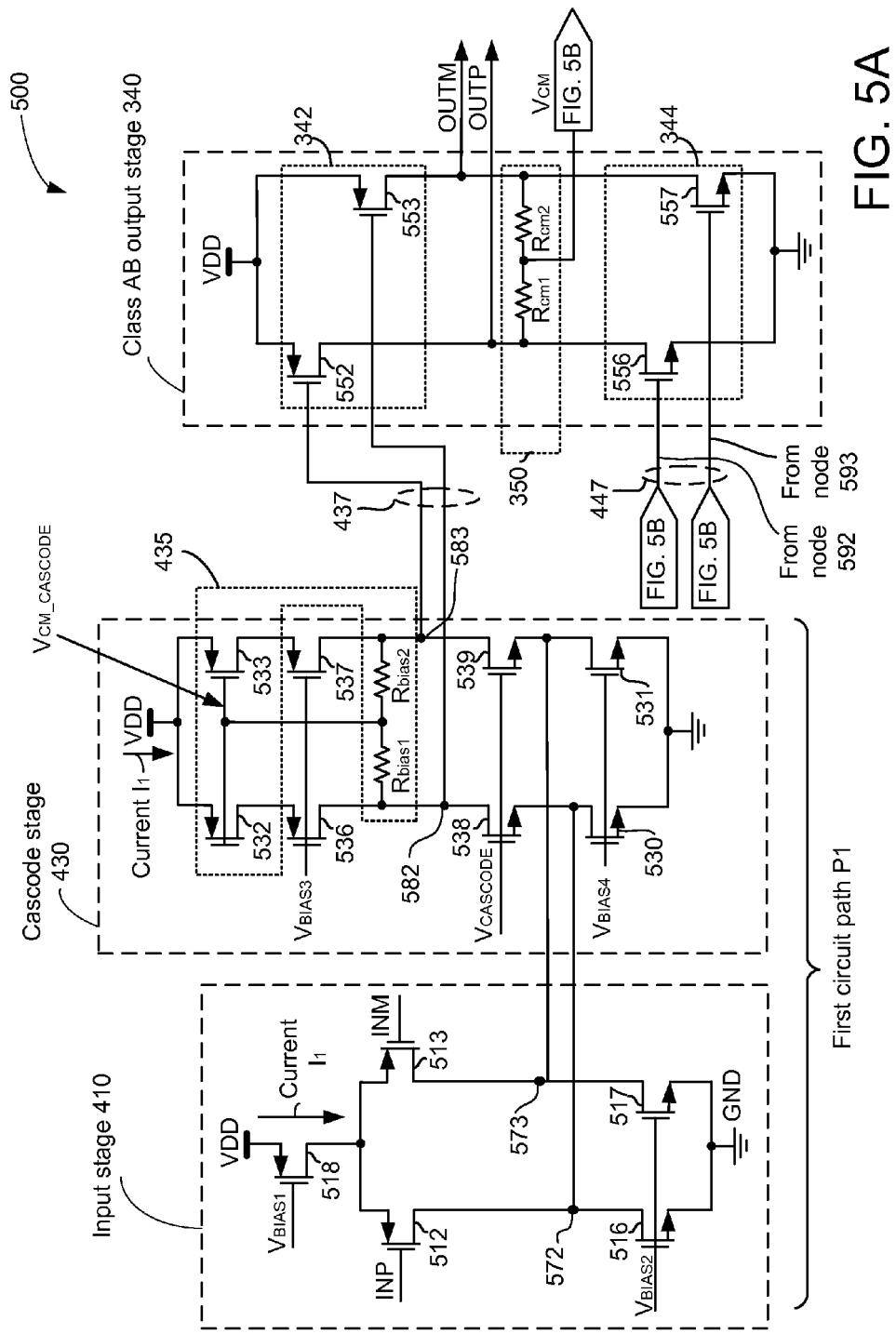

CLASS AB AMPLIFIER

TECHNICAL FIELD

The exemplary embodiments relate generally to amplifiers, and specifically to class AB amplifiers.

BACKGROUND OF RELATED ART

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to generate a modulated RF signal, amplify the modulated RF signal to generate a transmit RF signal having the proper output power level, and transmit the transmit RF signal via an antenna to a base station. For data reception, the receiver may obtain a received RF signal via the antenna and may amplify and process the received RF signal to recover data sent by the base station.

The wireless device may transmit and receive communication data through a communication medium. In one example, the communication medium may be a wireless communication medium where communication data are transmitted and received by communication devices according to a wireless communication protocol. Example wireless communication protocols may include IEEE 802.11 protocols (e.g., Wi-Fi) and BLUETOOTH® protocols according to the Bluetooth Special Interest Group. Moreover, example wireless communication protocols may further include Long Term Evolution or LTE. LTE is a set of enhancements to the Universal Mobile Telecommunications System (UMTS) mobile standard promulgated by Third Generation Partnership Project (3GPP). In some examples, LTE provides over-the-air wireless communication of high-speed data for mobile phones and data terminals.

Analog signals within the wireless devices may undergo amplification during various processing operations. Amplifiers are commonly used in these communication devices to provide signal amplification. Different types of amplifiers are available for different uses. For example, a wireless communication device such as a cellular phone may include a transmitter and a receiver for bi-directional communication. The transmitter may utilize a driver amplifier (DA) and a power amplifier (PA), the receiver may utilize a low noise amplifier (LNA), and the transmitter and receiver may utilize variable gain amplifiers (VGAs).

Various classes of amplifiers may be used for signal amplification. A "class A" amplifier operates in a linear region all the time and may have better linearity at the expense of greater power consumption. A "class B" amplifier typically employs two complementary output transistors, with each output transistor being turned on for half of the time and turned off for the other half of the time. Class B amplifiers may consume less power than class A amplifiers, but may be susceptible to crossover distortion caused when one of the output transistors turns off as the other output transistor turns on. A "class AB" amplifier may also employ two complementary output transistors (similar to a class B amplifier), albeit with each output transistor being turned on for more than half of the time in order to reduce crossover distortion. Thus, class AB amplifiers may provide a good compromise between linearity and power consumption.

Some class AB amplifiers may provide differential output signals. Controlling a common-mode voltage of the differential output signals may increase amplifier design complexity, operation, and/or cost. Thus, there is a need to improve common-mode voltage control of differential output signals associated with class AB amplifiers.

BRIEF DESCRIPTION OF THE DRAWINGS

The present embodiments are illustrated by way of example and are not intended to be limited by the figures of the accompanying drawings.

Like numbers reference like elements throughout the drawings and specification.

FIGS. 5A and 5B show an exemplary circuit diagram of a first embodiment of a class AB amplifier.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The present embodiments are not to be construed as limited to specific examples described herein but rather to include within their scope all embodiments defined by the appended claims.

In addition, the detailed description set forth below in connection with the appended drawings is intended as a description of exemplary embodiments of the present disclosure and is not intended to represent the only embodiments in which the present disclosure may be practiced. The term "exemplary" used throughout this description means "serving as an example, instance, or illustration," and should not necessarily be construed as preferred or advantageous over other embodiments.

A class AB amplifier with one or more biasing schemes for an associated output stage is described herein. The class AB amplifier may be used for various electronics devices such as wireless communication devices, cellular phones, personal digital assistants (PDAs), handheld devices, wireless modems, laptop computers, cordless phones, BLUETOOTH devices, broadcast receivers, etc. For clarity, the use of the class AB amplifier for a wireless communication device is described below.

Figure 1:
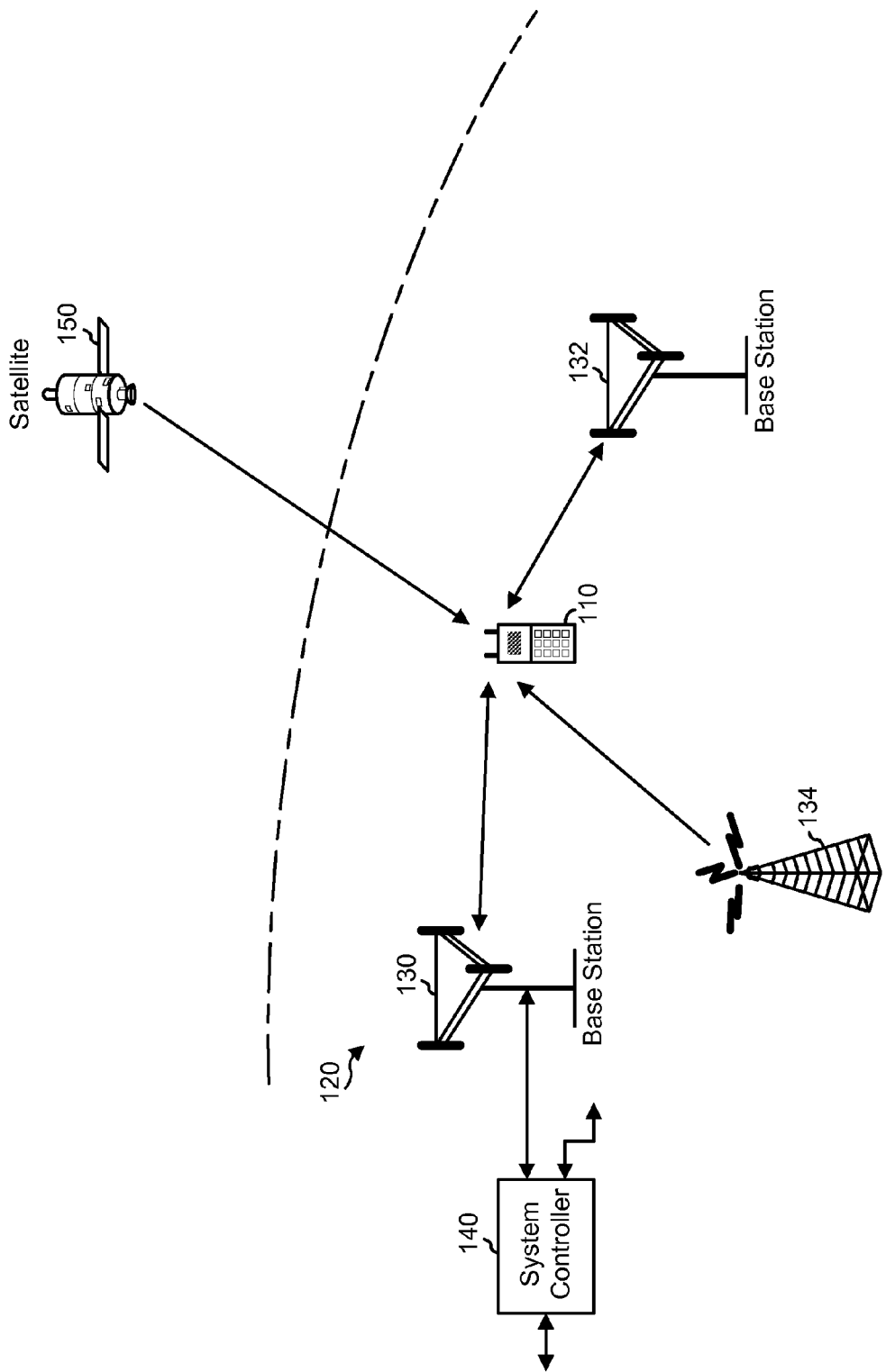
FIG. 1 is a diagram depicting a wireless device communicating with a wireless communication system, in accordance with some exemplary embodiments.

FIG. 1 is a diagram depicting a wireless device 110 communicating with a wireless communication system 120, in accordance with some exemplary embodiments. The wireless communication system 120 may be an LTE system, a Code Division Multiple Access (CDMA) system, a Global System for Mobile Communications (GSM) system, a wireless local area network (WLAN) system (e.g., a Wi-Fi system), or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows the wireless communication system 120 including two base stations 130 and 132 and one system controller 140. In general, a wireless system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may communicate with the wireless communication system 120. The wireless device 110 may also receive signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, WCDMA, CDMA 1x, EVDO, TD-SCDMA, GSM, 802.11, etc.

Figure 2:
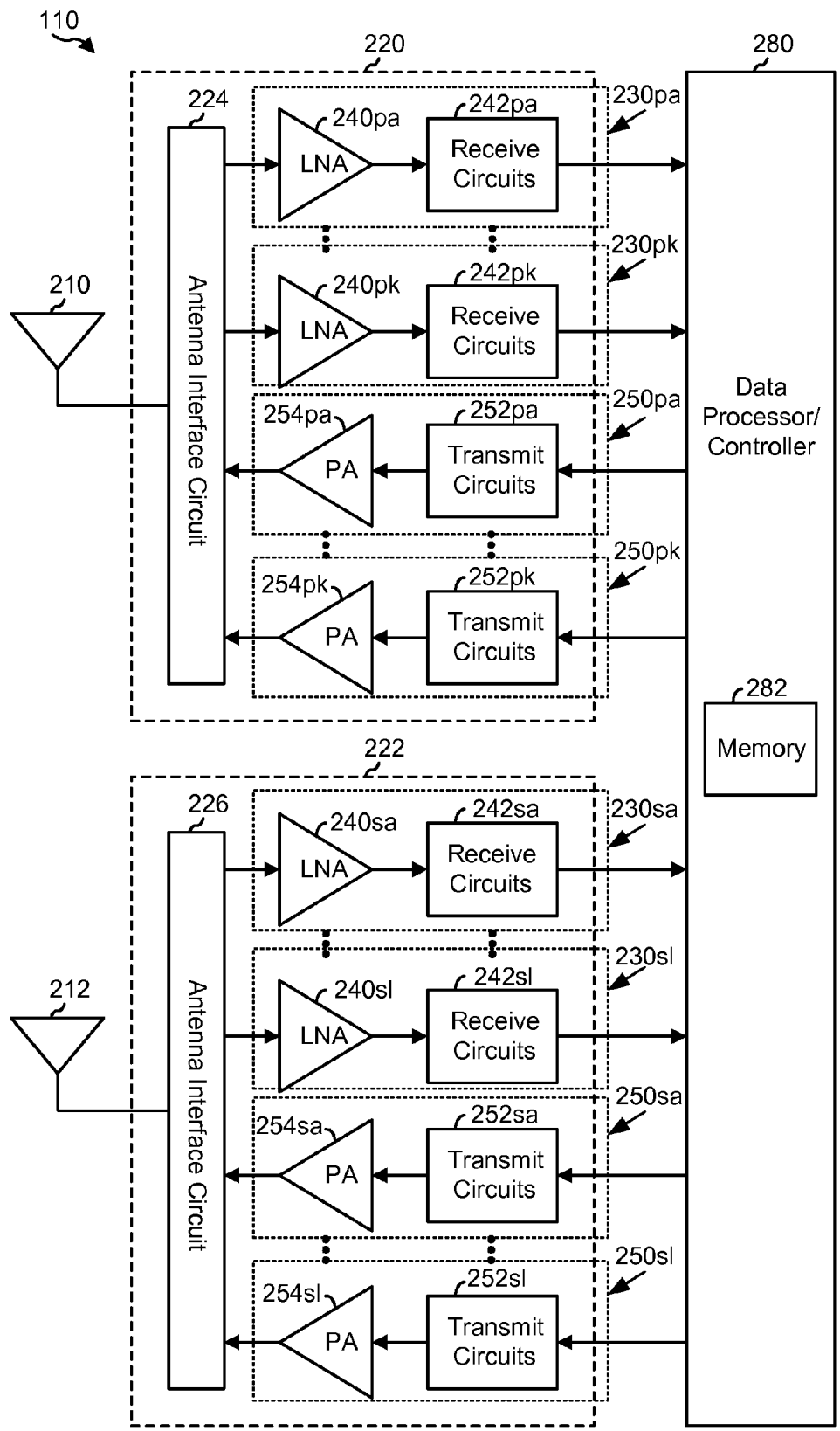
FIG. 2 shows a block diagram of an exemplary design of the wireless device depicted in FIG. 1.

FIG. 2 shows a block diagram of an exemplary design of the wireless device 110 in FIG. 1. In this exemplary design, the wireless device 110 includes a primary transceiver 220 coupled to a primary antenna 210, a secondary transceiver 222 coupled to a secondary antenna 212, and a data processor/controller 280. The primary transceiver 220 includes a number (K) of receivers 230*pa* to 230*pk* and a number (K) of transmitters 250*pa* to 250*pk* to support multiple frequency bands, multiple radio technologies, carrier aggregation, etc. The secondary transceiver 222 includes a number (L) of receivers 230*sa* to 230*sl* and a number (L) of transmitters 250*sa* to 250*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes a low noise amplifier (LNA) 240 and a receive circuit 242. For data reception, the primary antenna 210 receives signals from base stations and/or other transmitter stations and provides a received radio frequency (RF) signal, which is routed through an antenna interface circuit 224 and presented as an input RF signal to a selected receiver. The antenna interface circuit 224 may include switches, duplexers, transmit filters, receive filters, matching circuits, etc. The description below assumes that the receiver 230*pa* is the selected receiver. Within the receiver 230*pa*, an LNA 240*pa* amplifies the input RF signal and provides an output RF signal. The receive circuit 242*pa* may downconvert the output RF signal from RF to baseband, amplify and filter the downconverted signal, and provide an analog input signal to data processor/controller 280. The receive circuits 242*pa* may include mixers, filters, amplifiers, matching circuits, an oscillator, a local oscillator (LO) generator, a phase locked loop (PLL), etc. Each remaining receive 230 in the transceivers 220 and 222 may operate in similar manner as the receiver 230*pa*.

In the exemplary design shown in FIG. 2, each transmitter 250 includes transmit circuits 252 and power amplifiers (PA) 254. For data transmission, the data processor/controller 280 processes (e.g., encodes and modulates) data to be transmitted and provides an analog output signal to a selected transmitter. The description below assumes that transmitter 250*pa* is the selected transmitter. Within the transmitter 250*pa*, the transmit circuit 252*pa* may amplify, filter, and upconvert the analog output signal from baseband to RF and provide a modulated RF signal. The transmit circuit 252*pa* may include amplifiers, filters, mixers, matching circuits, an oscillator, an LO generator, a PLL, etc. A PA 254*pa* receives and amplifies the modulated RF signal and provides a transmit RF signal having the proper output power level. The transmit RF signal is routed through antenna interface circuit 224 and transmitted via primary antenna 210. Each remaining transmitter 250 in the transceivers 220 and 222 may operate in similar manner as the transmitter 250*pa*.

Each receiver 230 and transmitter 250 may also include other circuits not shown in FIG. 2, such as filters, matching circuits, etc. All or a portion of the transceivers 220 and 222 may be implemented on one or more analog integrated circuits (ICs), RF ICs (RFICs), mixed-signal ICs, etc. For example, the LNAs 240 and the receive circuits 242 within the transceivers 220 and 222 may be implemented on multiple IC chips. The circuits in the transceivers 220 and 222 may also be implemented in other manners.

The data processor/controller 280 may perform various functions for the wireless device 110. For example, the data processor/controller 280 may perform processing for data being received via the receivers 230 and data being transmitted via the transmitters 250. The data processor/controller 280 may control the operations of the various circuits within the transceivers 220 and 222. A memory 282 may store program codes and data for the data processor/controller 280. The data processor/controller 280 may be implemented on one or more application specific integrated circuits (ASICs) and/or other ICs.

As shown in FIG. 1, a transmitter (e.g., transmitter 250) and a receiver (e.g., receiver 230) may include various amplifiers. For example, the transmitter 250 may include one or more PAs 254 and/or driver amplifiers (not shown for simplicity). In a similar manner, receiver 230 may include one or more LNAs 240 or other amplifiers (not shown for simplicity).

Figure 3:
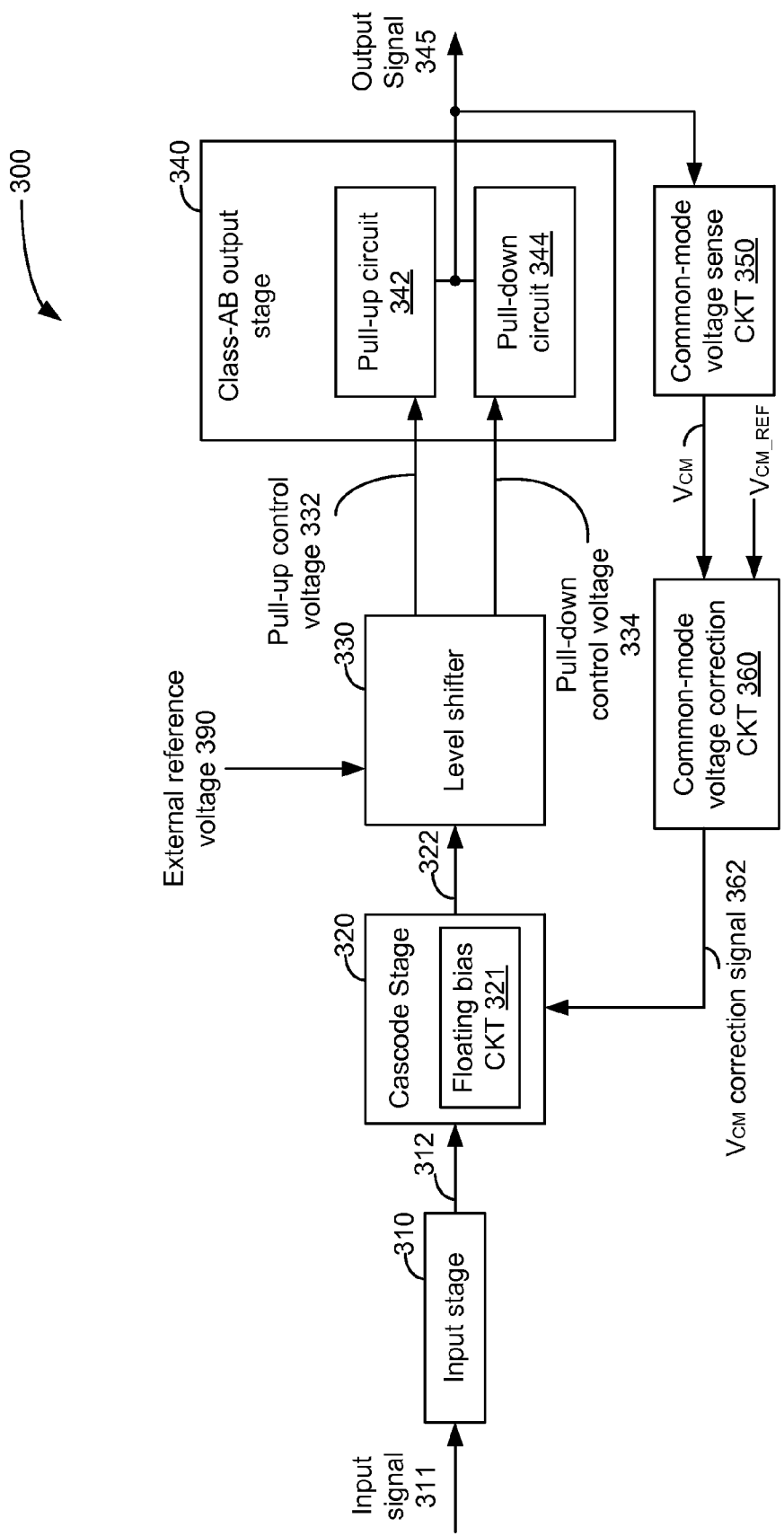
FIG. 3 is a block diagram of a prior art class AB amplifier.

FIG. 3 is a block diagram of a prior art class AB amplifier 300. The class AB amplifier 300 may be, for example, a folded-cascode class AB amplifier and may include an input stage 310, a cascode stage 320, a level-shifter 330, a class AB output stage 340, a common-mode voltage sense circuit 350, and a common-mode voltage correction circuit 360.

The input stage 310 may be configured to receive an input signal 311. In some embodiments, the input stage 310 may include a differential transistor pair in a common-source configuration to receive differential input signals (not shown for simplicity). The input stage 310 my further include a current sink (or a current source) to provide a bias current through the differential transistor pair. The input stage 310 may process the input signal 311 and provide an input stage output signal 312 to the cascode stage 320. In one embodiment, the input stage 310 generates the input stage output signal 312 based on a transconductance $g_m$ associated with the input stage 310.

The cascode stage 320, in one example, may generate a cascode stage output signal 322 based on the input stage output signal 312. In one embodiment, the cascode stage 320 may include a pair of common-gate transistors configured to function as a gain stage (not shown for simplicity). In some embodiments, the cascode stage 320 may generate the cascode stage output signal 322 based on a voltage gain $A_V$ (e.g., a gain factor determined by a ratio of the cascode stage output signal 322 to the input stage output signal 312). In some embodiments, the pair of common-gate transistors may receive a cascode voltage $V_{CASCODE}$, to control the voltage gain $A_V$. The cascode voltage $V_{CASCODE}$ may be set to allow output voltage swings of the cascode stage output signal 322 without having the pair of common-gate transistors enter into a saturation region. In this manner, the voltage gain $A_V$ may be substantially linear.

In one example, the cascode stage 320 may include a floating bias circuit 321 to provide a bias current and/or a bias voltage through one or more of common-gate transistors (not shown for simplicity). The floating bias circuit 321 may "float" with respect to a reference voltage or current. The bias current and/or bias voltage may be used by one or more transistors included in the cascode stage 320. For example, the bias current may be used to bias transistors used within one or more gain stages included within the cascode stage 320. The cascode stage 320 provides the cascode stage output signal 322 to the level shifter 330, which in turn generates a pull-up control voltage 332 and a pull-down control voltage 334 for the class AB output stage 340. In some embodiments, the level shifter 330 may generate the pull-up control voltage 332 and the pull-down control voltage 334 by shifting the cascode stage output signal 322 by an offset voltage (e.g., a direct-current (DC) or common-mode voltage offset). In some embodiments, the level shifter 330 may shift the cascode stage output signal 322 by utilizing an external reference voltage 390 in accordance with methods known in the art.

The class AB output stage 340 may include a pull-up circuit 342 and a pull-down circuit 344. In some embodiments, the pull-up circuit 342 may include one or more P-type metal-oxide-semiconductor (PMOS) transistors to receive the pull-up control voltage 332 and "pull-up" (e.g., drive) an output signal toward a power supply voltage (e.g., VDD). The pull-down circuit 344 may include one or more N-type metal-oxide-semiconductor (NMOS) transistors to receive the pull-down control voltage 334 and "pull-down" an output signal toward a relatively low voltage (e.g., a ground voltage). The PMOS and the NMOS transistors are not shown for simplicity.

In some embodiments, the class AB output stage 340 may turn on (e.g., operate) both the pull-up circuit 342 and pull-down circuit 344 for more than a half-cycle (assuming a sine wave input signal), resulting in a period of time during which both the pull-up circuit 342 and the pull-down circuit 344 are on. Accordingly, it may be advantageous to bias the pull-up circuit 342 and pull-down circuit 344 near their respective cutoff levels to reduce current drain during the time when both circuits 342 and 344 are on. As described above, in some embodiments, the level shifter 330 may generate these desired control voltages (e.g., the pull-up control voltage 332 and the pull-down control voltage 334) based on an external reference voltage 390.

In some embodiments, the class AB output stage 340 may generate an output signal 345 for the class AB amplifier 300. The output signal 345 may include differential signals, and the class AB amplifier 300 may utilize the common-mode voltage sense circuit 350 and the common-mode voltage correction circuit 360 to adjust or control a common-mode voltage $V_{CM}$ of the output signal 345. The common-mode voltage sense circuit 350 may sense the common-mode voltage $V_{CM}$ of the output signal 345, and may provide the common-mode voltage $V_{CM}$ to the common-mode voltage correction circuit 360. In some embodiments, the common-mode voltage correction circuit 360 may generate a $V_{CM}$ correction signal 362 based on the common-mode voltage $V_{CM}$ and a reference common-mode voltage $V_{CM\ REF}$. The common-mode voltage correction circuit 360 may provide the $V_{CM}$ correction signal 362 to the cascode stage 320. The cascode stage 320 may adjust (e.g., correct) the common-mode voltage $V_{CM}$ of the output signal 345 through the cascode stage output signal 322.

Figure 4:
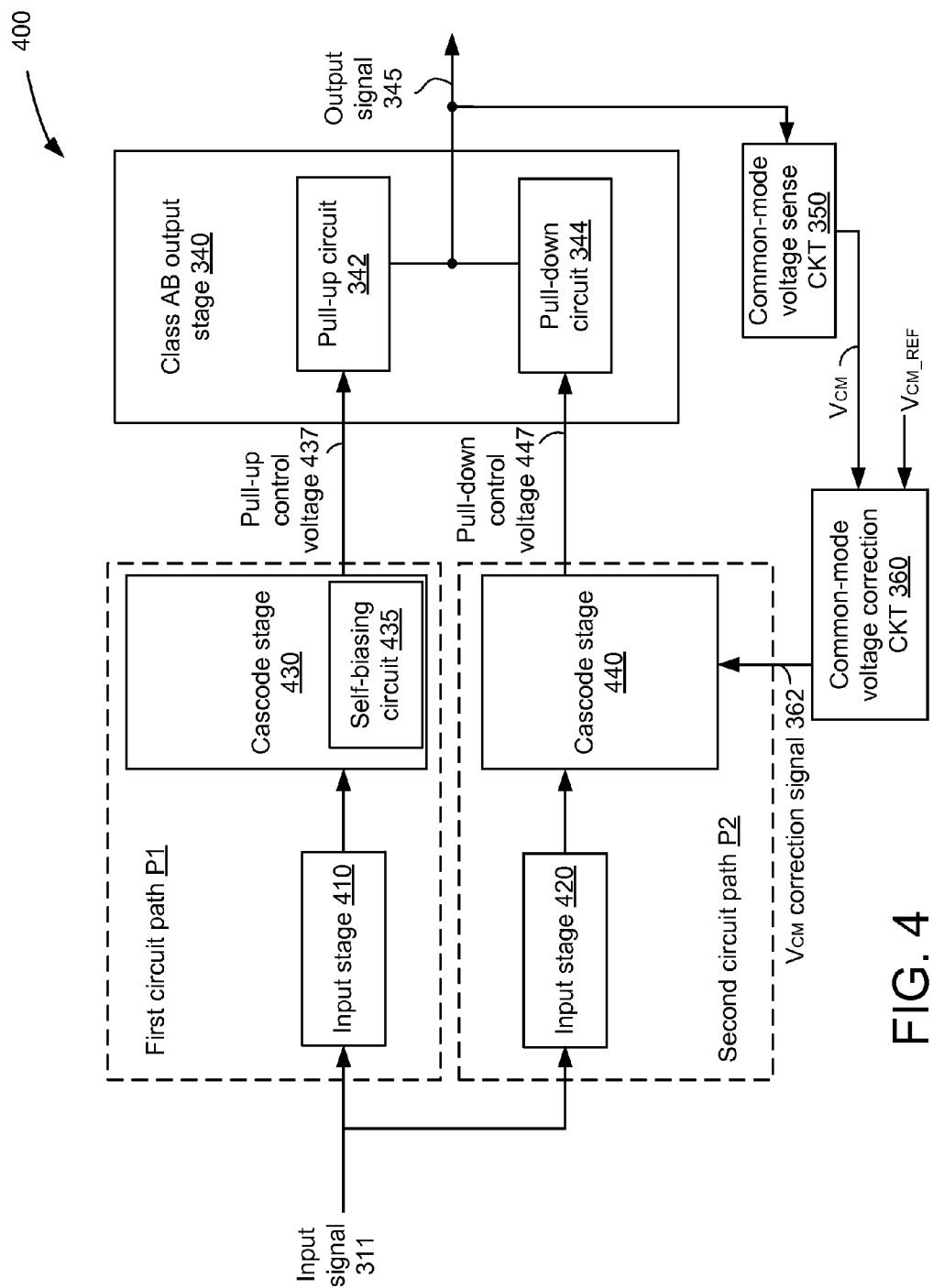
FIG. 4 is a block diagram depicting another embodiment of an exemplary class AB amplifier.

FIG. 4 is a block diagram depicting another embodiment of an exemplary class AB amplifier 400, in accordance with example embodiments. The class AB amplifier 400 may include a first circuit path P1 to receive the input signal and generate a pull-up control voltage 437, and may include a second circuit path P2 to receive the input signal and generate a pull-down control voltage 447. The class AB amplifier 400 may further include the class AB output stage 340 with the pull-up circuit 342 and the pull-down circuit 344, for example, as described above with respect to FIG. 3. The class AB amplifier 400 may further include the common-mode voltage sense circuit 350 and the common-mode voltage correction circuit 360 of FIG. 3. The class AB output stage 340, the common-mode voltage sense circuit 350, and the common-mode voltage correction circuit 360 may operate in a similar manner as described above with respect to FIG. 3.

By generating the pull-up control voltage 437 and the pull-down control voltage 447 in separate circuit paths (e.g., circuit paths P1 and P2), each of the control voltages may be independently controlled and/or adjusted. The first circuit path P1 may include an input stage 410 and a cascode stage 430 to generate the pull-up control voltage 437. In a similar manner, the second circuit path P2 may include an input stage 420 and a cascode stage 440 to generate the pull-down control voltage 447. The input stages 410 and 420 may receive the same input signal, and in some embodiments, may use similar circuits. In some embodiments, at least one of the cascode stages 430 and 440 may utilize a self-biasing scheme, and therefore, no external reference signals (e.g., the external reference signal 390) may be needed to generate the associated control voltages. For example, the cascode stage 430 may include a self-biasing circuit 435 which utilizes a common-mode voltage of the cascode stage 430 to generate a self-biasing voltage and/or current. Persons of ordinary skill in the art will recognize that other cascode stages, such as the cascode stage 440, may include the self-biasing circuit 435. FIGS. 5-8 below illustrate example embodiments of the class AB amplifier 400. These examples are not meant to be limiting, but rather illustrate possible circuit implementations of the class AB amplifier 400.

Figure 5B:
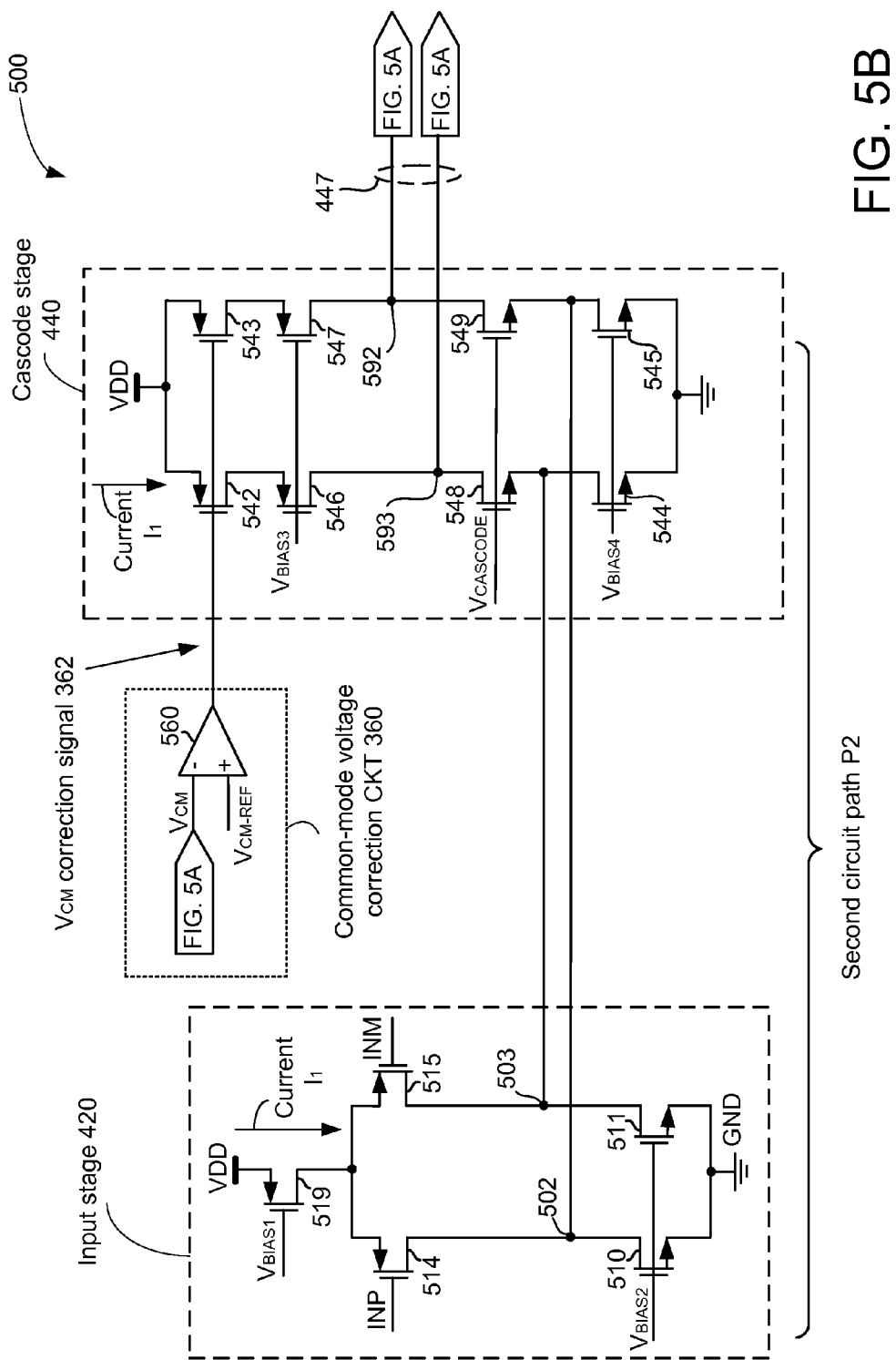

FIGS. 5A and 5B show an exemplary circuit diagram of a class AB amplifier 500 in accordance with a first embodiment. The class AB amplifier 500 may be one embodiment of the class AB amplifier 400 of FIG. 4. As is known in the art, implementations of the class AB amplifier 500 may not be limited to the NMOS and PMOS transistor structures presented in FIGS. 5A and 5B. For example, the input stage 410 (described below) is shown to include a PMOS transistor differential pair. Persons of ordinary skill in the art will recognize that the input stage may be implemented with an NMOS transistor differential pair or other types of transistors.

FIG. 5A illustrates the first circuit path P1, the class AB output stage 340, and the common-mode voltage sense circuit 350 of class AB amplifier 500. The first circuit path P1 includes the input stage 410 and the cascode stage 430. In some embodiments, the cascode stage 430 may be a folded cascode stage. The input stage 410 may include PMOS transistors 512 and 513 forming a PMOS differential pair. The PMOS transistors 512 and 513 may receive input signals INP and INM, respectively, that form the differential input signal 311 of FIG. 3. A PMOS transistor 518 may operate as a current source and provide a current $I_1$ through the input stage 410. The PMOS transistor 512 may be coupled to an NMOS transistor 516 through node 572, and the PMOS transistor 513 may be coupled to an NMOS transistor 517 through node 573. The NMOS transistors 516 and 517 may operate as a current sink and/or as a current-mirror load for the input stage 410. As described above, the input stage 410 may drive output signals (e.g., currents) through the nodes 572 and 573 based on the input signals INP and INM and the transconductance $g_m$ of the PMOS transistors 512 and 513. For example, the currents flowing through the nodes 572 and 573 may be some examples of the input stage output signal 312 provided to the cascode stage 430.

The PMOS transistor 518 may be biased by a bias voltage $V_{BIAS1}$, and the NMOS transistors 516 and 517 may be biased by a bias voltage $V_{BIAS2}$. The bias voltages $V_{BIAS1}$ and $V_{BIAS2}$ may be generated in accordance with schemes known in the art, and therefore the generation thereof is not discussed for simplicity.

The cascode stage 430 may include NMOS transistors 530, 531, 538, and 539, which may be coupled to the nodes 572 and 573, as shown in FIG. 5A. The cascode stage 430 may also include PMOS transistors 536 and 537 configured as a current source to provide currents through the nodes 582 and 583. The cascode stage 430 may further include the self-biasing circuit 435 for biasing the pull-up control voltage 437 appearing between the nodes 582 and 583, which is provided to the class AB output stage 340.

The cascode stage 430 and the input stage 410 may form, in part, a folded cascode amplifier (e.g., the cascode stage 430 may be "folded" about nodes 572 and 573). In some embodiments, the PMOS transistors 536 and 537 may be biased by a bias voltage $V_{BIAS3}$ to produce a current $I_1$ (e.g., similar to the current in the input stage 410). The bias voltage $V_{BIAS3}$ may be generated in accordance with known schemes in the art.

The NMOS transistors 530, 531, 538, and 539 may be configured as common-gate transistors. In some embodiments, the NMOS transistors 538 and 539 may be biased by the cascode voltage $V_{CASCODE}$. The NMOS transistors 530 and 531 may be biased by a bias voltage $V_{BIAS4}$. The NMOS transistors 538 and 539 may provide voltages and/or currents onto the nodes 582 and 583 based on a voltage gain Av, current through the nodes 572, 573, $V_{CASCODE}$, and $V_{BIAS4}$. The voltages on the nodes 582 and 583 may be provided to the pull-up circuit 342 of the class AB output stage 340 as the pull-up control voltage 437. The bias voltages $V_{BIAS4}$ and $V_{CASCODE}$ may be generated in accordance with known schemes in the art.

The self-biasing circuit 435 may be configured to bias the cascode stage 430 without relying on external reference signals (e.g., the external reference voltage 390). In some embodiments, the self-biasing circuit 435 may include resistors $R_{BIAS1}$ and $R_{BIAS2}$ and PMOS transistors 532 and 533. The resistors $R_{BIAS1}$ and $R_{BIAS2}$ may be configured as a voltage divider and may be coupled to the nodes 582 and 583. When the resistances of the resistors $R_{BIAS1}$ and $R_{BIAS2}$ are substantially equal, the resistors $R_{BIAS1}$ and $R_{BIAS2}$ may sense an average (e.g., common-mode) voltage of the pull-up control voltage 437. In other words, the resistors $R_{BIAS1}$ and $R_{BIAS2}$ may sense a common-mode voltage ($V_{CM-CASCODE}$) of the cascode stage and provide $V_{CM-CASCODE}$ to the PMOS transistors 532 and 533. During differential operations, no differential swings may be passed onto the gates of the PMOS transistors 532 and 533. The PMOS transistors 532 and 533 may operate as current sources for the cascode stage 430. In this manner, the value of $V_{CM-CASCODE}$ may be used to self-bias the cascode stage 430.

The class AB output stage 340 may include the pull-up circuit 342 which, in turn, may include PMOS transistors 552 and 553. The PMOS transistors 552 and 553 may receive the pull-up control voltage 437. The class AB output stage 340 further includes the pull-down circuit 344 which, in turn, may include the NMOS transistors 556 and 557. The NMOS transistors 556 and 557 may receive the pull-down control voltage 447. The generation of the pull-down control voltage 447 is described below with respect to FIG. 5B. Operation of the PMOS transistors 552 and 553 and the NMOS transistors 556 and 557 may generate output signals OUTP and OUTM that together form the differential output signal 345.

The class AB output stage 340 may include the common-mode voltage sense circuit 350. In some embodiments, the common-mode voltage sense circuit 350 may be coupled to the output signals OUTP and OUTM to generate (e.g., sense) the common-mode voltage $V_{CM}$ of the output signals OUTP and OUTM. In some embodiments, the common-mode voltage sense circuit 350 may include resistors $R_{CM1}$ and $R_{CM2}$ configured as a voltage divider. When the resistances of the resistors $R_{CM1}$ and $R_{CM2}$ are substantially equal, the common-mode voltage sense circuit 350 senses the common-mode voltage $V_{CM}$ of the output signals OUTP and OUTM by generating an average voltage of the output signals OUTP and OUTM. The common-mode voltage $V_{CM}$ is provided to the common-mode voltage correction circuit 360, which is described in further detail below in conjunction with FIG. 5B.

FIG. 5B illustrates the second circuit path P2 and the common-mode voltage correction circuit 360 of class AB amplifier 500. The second circuit path P2 includes the input stage 420 and the cascode stage 440. In some embodiments, the cascode stage 440 may be a folded cascode stage. The input stage 420 may include PMOS transistors 514 and 515 forming a PMOS differential pair. The PMOS transistors 514 and 515 may receive the input signals INP and INM, respectively, that form the differential input signal 311. A PMOS transistor 519 may operate as a current source and provide a current $I_1$ through the input stage 420. The PMOS transistor 514 may be coupled to an NMOS transistor 510 through node 502, and the PMOS transistor 515 may be coupled to an NMOS transistor 511 through node 503. The NMOS transistors 510 and 511 may operate as a current sink and/or as a current-mirror load for the input stage 420. As described above, the input stage 420 may drive output signals through the nodes 502 and 503 based on the input signals INP and INM and the transconductance $g_m$ of the PMOS transistors 514 and 515. The currents flowing through the nodes 502 and 503 may be some examples of the input stage output signal 312 provided to the cascode stage 440, as described above with respect to FIG. 3. The PMOS transistor 519 may be biased by the bias voltage $V_{BIAS1}$, and the NMOS transistors 510 and 511 may be biased by the bias voltage $V_{BIAS2}$.

The cascode stage 440 may include NMOS transistors 544, 545, 548, and 549 which may be coupled to nodes 592 and 593. The cascode stage 440 may also include PMOS transistors 546 and 547 configured as a current source to provide currents through the nodes 592 and 593.

The cascode stage 440 and the input stage 420 may form, in part, a folded cascode amplifier (e.g., the cascode stage 440 may be "folded" about the nodes 502 and 503). In some embodiments, the cascode stage 440 may be similar to the cascode stage 430. For example, the cascode stage 440 may include PMOS transistors 546 and 547 which may be configured as a current source and may be similar to the PMOS transistors 536 and 537 (described above with respect to FIG. 5A). The PMOS transistors 546 and 547 may be biased by the bias voltage $V_{BIAS3}$ and may be configured to provide a current $I_1$, similar to the PMOS transistors 536 and 537 of the cascode stage 430.

The cascode stage 440 may generate the pull-down control voltage 447 through the nodes 592 and 593, which may be provided to the pull-down circuit 344 of the class AB output stage 340. The pull-down control voltage 447 may be adjusted based on the common-mode voltage $V_{CM}$ of the output signals OUTP and OUTM. The cascode stage 440 may include PMOS transistors 542 and 543 to change the pull-down control voltage 447 and thereby change the common-mode output voltage $V_{CM}$ of the output signals OUTP and OUTM of the class AB output amplifier 500.

The common-mode voltage correction circuit 360, in some embodiments, may provide a negative feedback signal based on the common-mode voltage $V_{CM}$. In some embodiments, an amplifier 560 may receive the common-mode voltage $V_{CM}$ and compare $V_{CM}$ to the reference common-mode voltage $V_{CM\_REF}$ (e.g., a target common-mode voltage for the output signals OUTP and OUTM). Thus, the amplifier 560 may operate as a common-mode feedback amplifier and generate the $V_{CM}$ correction signal 362 that may be coupled to the PMOS transistors 542 and 543. In this manner, the class AB amplifier 400 may adjust the common-mode voltage $V_{CM}$ of the output signals OUTP and OUTM toward the reference common-mode voltage $V_{CM\_REF}$.

An example operation of class AB amplifier 500 is described below. When the common-mode voltage $V_{CM}$ is greater than the reference common-mode voltage $V_{CM\_REF}$, a magnitude of the $V_{CM}$ correction signal 362 may be decreased by amplifier 560. Decreasing the magnitude of $V_{CM}$ correction signal 362 may cause the current provided by the PMOS transistors 542 and 543 to increase, thereby increasing the pull-down control voltage 447. In response thereto, the current provided by the pull-down circuit 344 (formed by the NMOS transistors 556 and 557) may increase, and thus the common-mode voltage $V_{CM}$ may be decreased. On the other hand, when the common-mode voltage $V_{CM}$ is less than the reference common-mode voltage $V_{CM\_REF}$) the magnitude of $V_{CM}$ correction signal 362 may be increased by amplifier 560. Increasing the magnitude of $V_{CM}$ correction signal 362 may cause the current provided by the PMOS transistors 542 and 543 to decrease, thereby decreasing the pull-down control voltage 447. In response thereto, the current provided by the pull-down circuit 344 (formed by the NMOS transistors 556 and 557) may decrease, and thus the common-mode voltage $V_{CM}$ may be increased.

As described above, the exemplary class AB amplifier 400 may include two circuit paths. The first circuit path P1 may generate the pull-up control voltage 437 based on a self-biasing scheme. The second circuit path P2 may generate the pull-down control voltage 447 based on the common-mode voltage $V_{CM}$ of the output signals OUTP and OUTM. In other embodiments, the first circuit path P1 may generate the pull-up control voltage 437 based on the common-mode voltage $V_{CM}$ of the output signals OUTP and OUTM, while the second circuit path P2 may generate the pull-down control voltage 447 based on a self-biasing circuit 435. This is described below in conjunction with FIGS. 6A and 6B.

Figure 6A:
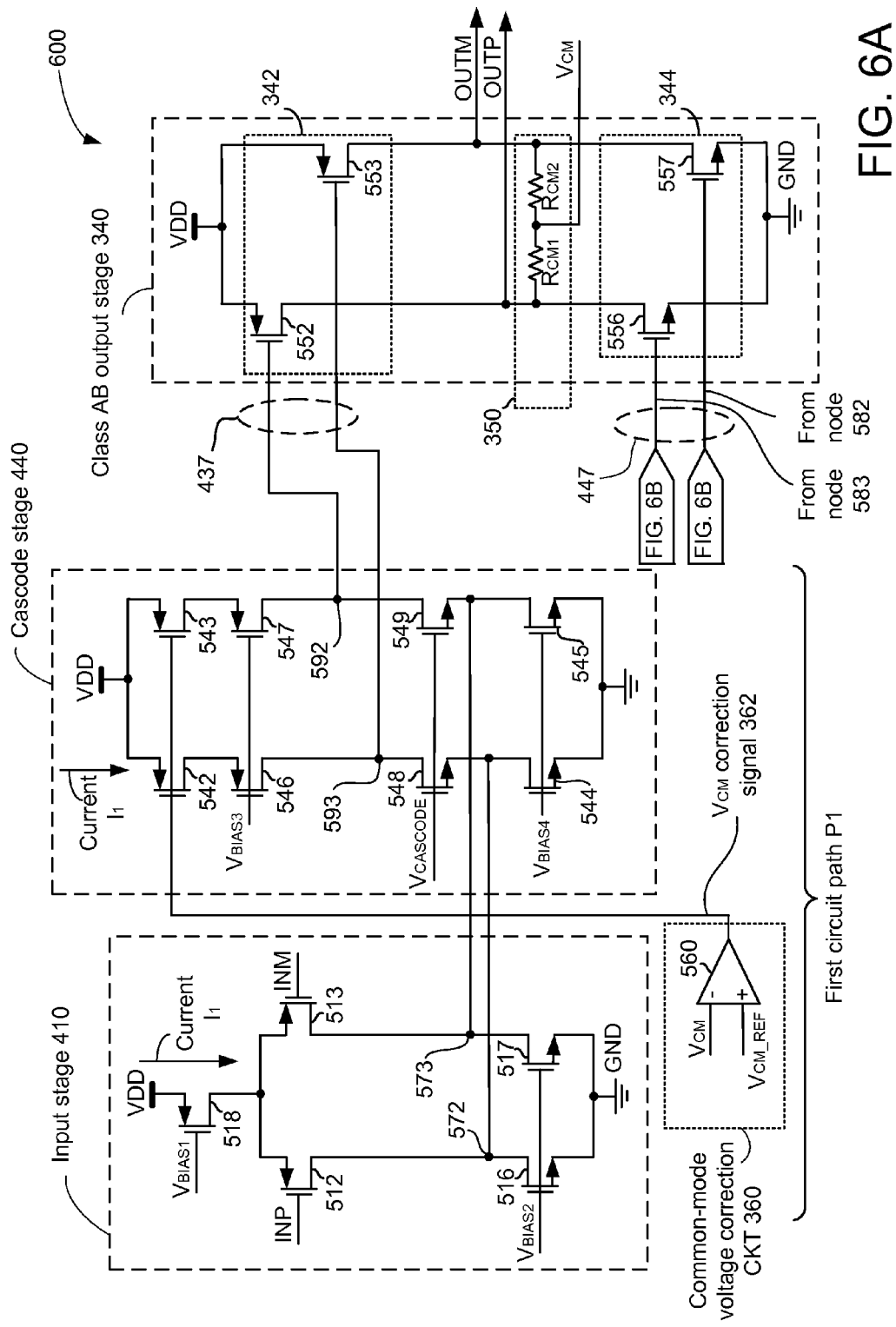
FIGS. 6A and 6B show an exemplary circuit diagram of a second embodiment of a class AB amplifier.
Figure 6B:
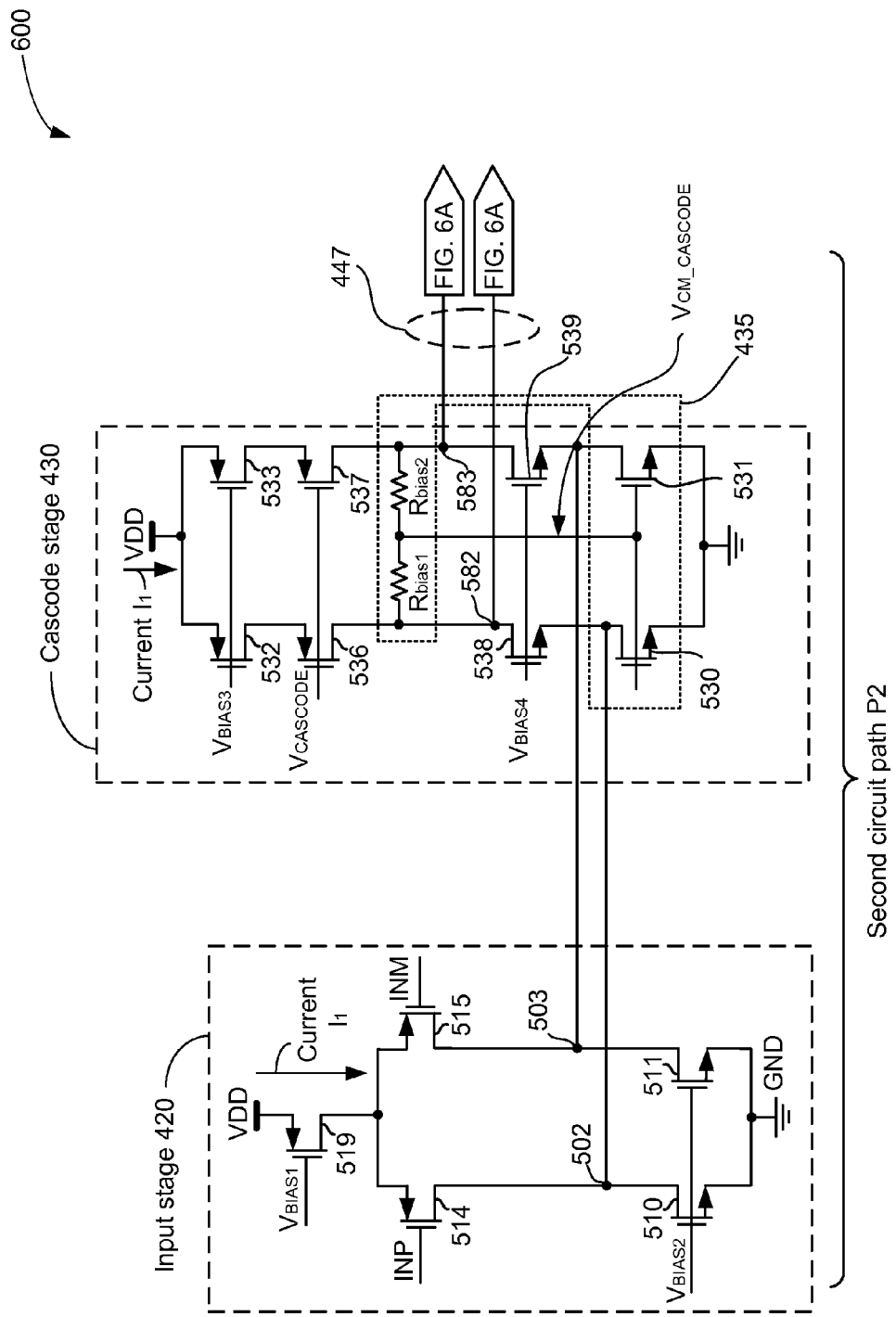

FIGS. 6A and 6B show an exemplary circuit diagram of a class AB amplifier 600 in accordance with a second embodiment. The exemplary class AB amplifier 600 includes two circuit paths P1 and P2. In contrast to the class AB amplifier 500 of FIGS. 5A and 5B, the first circuit path P1 generates the pull-up control voltage 437 and controls the common-mode voltage $V_{CM}$ of the output signals OUTM and OUTP based on the feedback of the common-mode voltage $V_{CM}$ of the output signals. The second circuit path P2 generates the pull-down control voltage 447 based on a self-biasing scheme.

FIG. 6A illustrates the first circuit path P1, the class AB output stage 340, and the common-mode voltage correction circuit 360 of class AB amplifier 600. The first circuit path P1 may include the input stage 410 and the cascode stage 440. The input stage 410 and the cascode stage 440 may be similar to the input stage 410 and the cascode stage 440 described above with respect to FIGS. 5A and 5B. As described above with respect to FIGS. 4 and 5A-5B, the input stage 410 may receive the input signals INP and INM and drive output signals (e.g., currents) through the nodes 572 and 573. The currents flowing through the nodes 572 and 573 may be coupled to cascode stage 440.

As described above, the cascode stage 440 may generate control signals for class AB output stage 340. In contrast to the embodiment of FIGS. 5A-5B, for the embodiment of FIGS. 6A-6B, the cascode stage 440 may generate pull-up control voltage 437. The pull-up control voltage 437 may be based on the common-mode voltage $V_{CM}$ of the output signals OUTM and OUTP. For example, the cascode stage 440 may include PMOS transistors 546 and 547 which may be configured as a current source. The PMOS transistors 546 and 547 may be biased by the bias voltage $V_{BIAS3}$ and may be configured to provide a current I. The cascode stage 440 may generate the pull-up control voltage 437 through the nodes 592 and 593, which may be provided to the pull-up circuit 342 of the class AB output stage 340. The pull-up control voltage 437 may be adjusted based on the common-mode voltage $V_{CM}$ of the output signals OUTP and OUTM. The cascode stage 440 may include PMOS transistors 542 and 543 to change the pull-up control voltage 437 and thereby change the common-mode output voltage of the output signals OUTP and OUTM of the class AB output amplifier 600.

The common-mode voltage correction circuit 360 may provide a negative feedback signal based on the common-mode voltage $V_{CM}$. In some embodiments, an amplifier 560 may receive the common-mode voltage $V_{CM}$ and compare $V_{CM}$ to the reference common-mode voltage $V_{CM\text{-}REF}$. The amplifier 560 may generate the $V_{CM}$ correction signal 362 that may be coupled to the PMOS transistors 542 and 543.

The class AB output stage 340 may include the pull-up circuit 342 which, in turn, may include the PMOS transistors 552 and 553. The PMOS transistors 552 and 553 may receive the pull-up control voltage 437. The class AB output stage 340 further includes the pull-down circuit 344 which, in turn, may include the NMOS transistors 556 and 557 to receive the pull-down control voltage 447 (see also FIG. 6B).

As described above, the class AB output stage 340 may include the common-mode voltage sense circuit 350. In some embodiments, the common-mode voltage sense circuit 350 is coupled to the output signals OUTP and OUTM to generate (e.g., sense) the common-mode voltage $V_{CM}$ of the output signals OUTP and OUTM. In some embodiments, the common-mode voltage sense circuit 350 may include resistors $R_{CM1}$ and $R_{CM2}$ configured as a voltage divider. The common-mode voltage $V_{CM}$ is provided to the common-mode voltage correction circuit 360.

FIG. 6B illustrates the second circuit path P2 of class AB amplifier 600, which may include the input stage 420 and the cascode stage 430. As described above, the cascode stage 430 may include the self-biasing circuit 435 to generate a self-biasing voltage and/or current.

The input stage 420 may receive the input signals INP and INM and drive output currents through the nodes 502 and 503. The currents flowing through nodes 502 and 503 may be coupled to the cascode stage 430.

The cascode stage 430 may include NMOS transistors 530, 531, 538, and 539, which may be coupled to nodes 502 and 503. The cascode stage 430 may also include PMOS transistors 532, 533, 536, and 537 to provide currents through the nodes 582 and 583. The cascode stage 430 may further include the self-biasing circuit 435 for biasing the pull-down control voltage 447 through nodes 582 and 583 which is provided to the class AB output stage 340.

The PMOS transistors 532, 533, 536, and 537 may be configured as common-gate transistors. In some embodiments, the PMOS transistors 536 and 537 may be biased by the cascode voltage $V_{CASCODE}$. The PMOS transistors 532 and 533 may be biased by the bias voltage $V_{BIAS4}$. The PMOS transistors 536 and 537 may provide voltages and/or currents onto the nodes 582 and 583 based on a voltage gain Av, current through nodes 502, 503, $V_{CASCODE}$, and $V_{BIAS4}$. The voltages on the nodes 582 and 583 may be provided to the pull-down circuit 344 of the class AB output stage 340 as the pull down control voltage 447.

The self-biasing circuit 435 may be configured to bias the cascode stage 435 without relying on an external reference signal. In some embodiments, the self-biasing circuit 435 may include resistors $R_{BIAS1}$ and $R_{BIAS2}$ and the NMOS transistors 530 and 531. The resistors $R_{BIAS1}$ and $R_{BIAS2}$ may be configured as a voltage divider and may be coupled to nodes 582 and 583. In some embodiments, the resistors $R_{BIAS1}$ and $R_{BIAS2}$ may sense a common-mode voltage ($V_{CM\text{-}CASCODE}$) of the cascode stage 430 and provide $V_{CM\text{-}CASCODE}$ to the NMOS transistors 531 and 531. During differential operations, no differential swings may be passed onto the gates of the NMOS transistors 530 and 531. The NMOS transistors 530 and 531 may operate as current sources for the cascode stage 430.

Figure 7A:
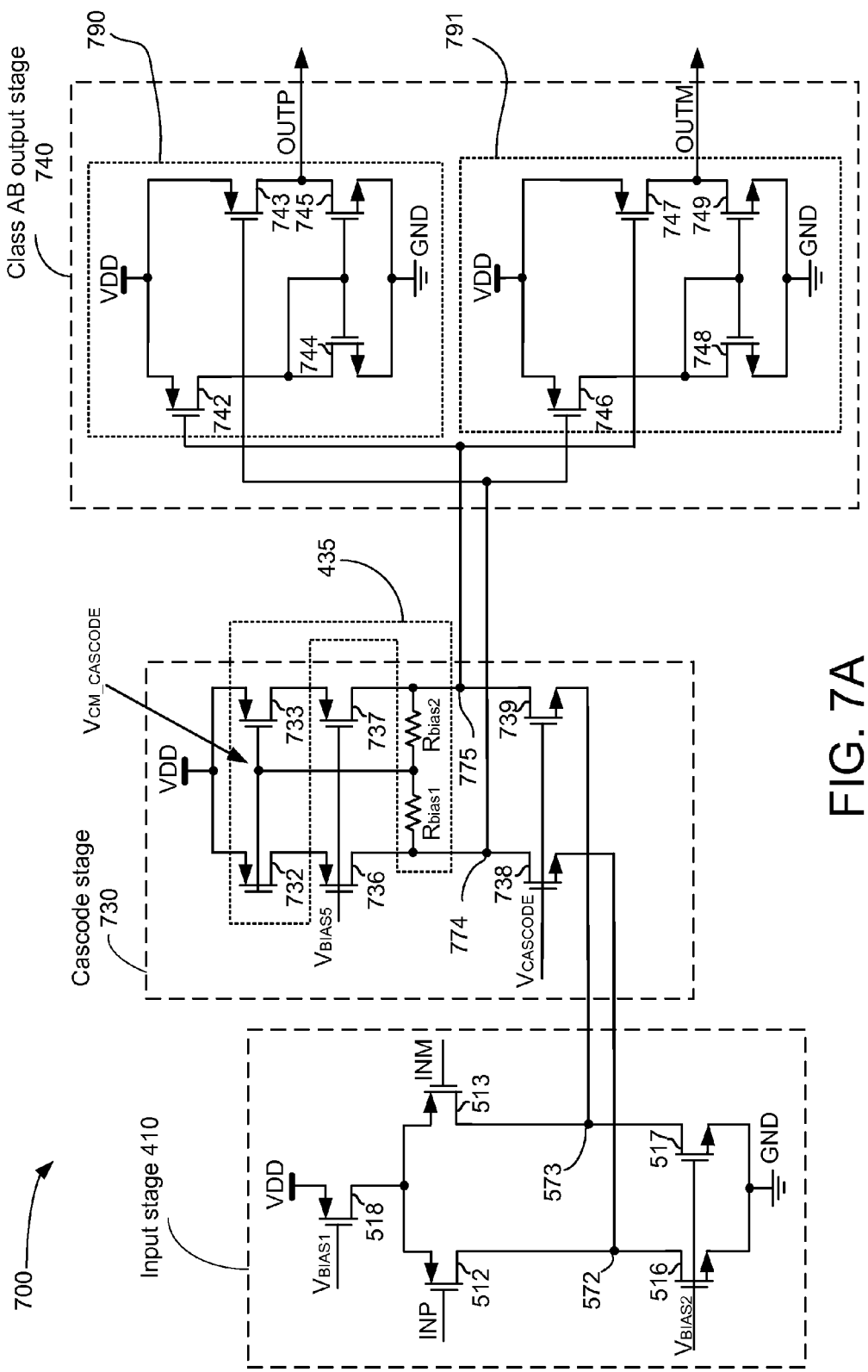
FIGS. 7A and 7B show an exemplary circuit diagram of a third embodiment of a class AB amplifier.
Figure 7B:
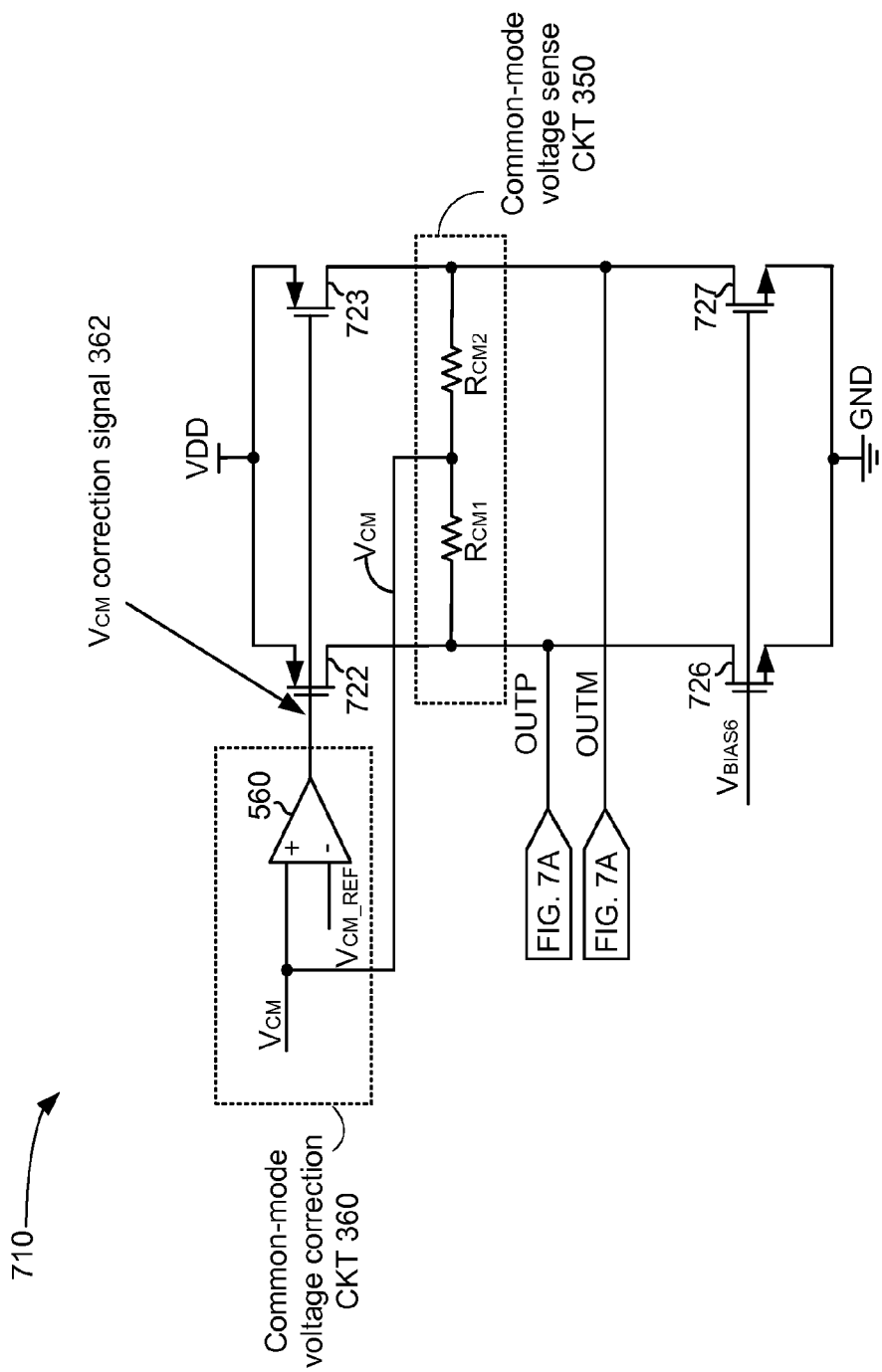

FIGS. 7A and 7B show an exemplary circuit diagram of a class AB amplifier 700 in accordance with a third embodiment. FIG. 7A is shown to include the input stage 410, a cascode stage 730, and a class AB output stage 740 of the class AB amplifier 700. In some embodiments, the input stage 410 may be similar to the input stage 410 described in FIGS. 4 and 5A. Thus, input stage 410 may receive input signals INP and INM and generate output signals through the nodes 572 and 573. The output signals may be coupled to the cascode stage 730.

The cascode stage 730 may be a self-biasing cascode stage and may include PMOS transistors 732, 733, 736, and 737, NMOS transistors 738 and 739, and self-biasing circuit 435. The PMOS transistors 736 and 737 may be configured as a current source to provide a current through nodes 774 and 775. The PMOS transistors 736 and 737 may be biased by a bias voltage $V_{BIAS5}$. The NMOS transistors 738 and 739 may control voltages on respective nodes 774 and 775 based on a voltage gain $A_v$, current through nodes 572 and 573, and $V_{CASCODE}$. The voltages on nodes 774 and 775 may be coupled to the class AB output stage 740.

The class AB output stage 740 may include a first output driver 790 and a second output driver 791. The first output driver 790 may generate the output signal OUTP, and the second output driver 791 may generate the output signal OUTM. The first output driver 790 and the second output driver 791 may be configured to receive the voltages from the nodes 774 and 775. The first output driver 790 may include a PMOS transistor 743 to operate as the pull-up circuit (e.g., similar to pull-up circuit 342 in FIG. 3). A current-mirror/sink including NMOS transistors 744 and 745 may operate as the pull-down circuit (e.g., similar to pull-down circuit 344 in FIG. 3). The NMOS transistors 744 and 745 may be controlled by the PMOS transistor 742.

In a similar manner, the second output driver 791 may include a PMOS transistor 747 to operate as the pull-up circuit (e.g., similar to pull-up circuit 342 in FIG. 3). A current-mirror/sink including NMOS transistors 748 and 749 may operate as the pull-down circuit (e.g., similar to pull-down circuit 344 in FIG. 3). The NMOS transistors 748 and 749 may be controlled by the PMOS transistor 746.

FIG. 7B illustrates a common-mode voltage control circuit 710 for the class AB amplifier 700. The common-mode voltage control circuit 710 circuit may include the common-mode voltage correction circuit 360, the common-mode voltage sense circuit 350, PMOS transistors 722 and 723, and NMOS transistors 726 and 727. As described above with respect to FIGS. 5A, 5B, 6A, and 6B, the common-mode voltage sense circuit 350 may sense the common-mode voltage $V_{CM}$ of the output signals OUTP and OUTM. The common-mode voltage correction circuit 360 may generate the $V_{CM}$ correction signal 362 based on the common-mode voltage $V_{CM}$ and the reference common-mode voltage $V_{CM\_REF}$.

The NMOS transistors 726 and 727 and the PMOS transistors 722 and 723 may control the common-mode voltage $V_{CM}$ of the output signals OUTP and OUTM. In some embodiments, current through the PMOS transistors 722 and 723 may be controlled by the $V_{CM}$ correction signal 362. Current through the NMOS transistors 726 and 727 may be controlled by a bias voltage $V_{BIAS6}$. Thus, currents through the PMOS transistors 722 and 723 may be varied in response to the common-mode voltage $V_{CM}$. Since the currents through the NMOS transistors 726 and 727 may remain relatively constant due to the voltage of $V_{BIAS6}$, changing the currents through PMOS transistors 722 and 723 may control the common-mode voltage $V_{CM}$.

Figure 8A:
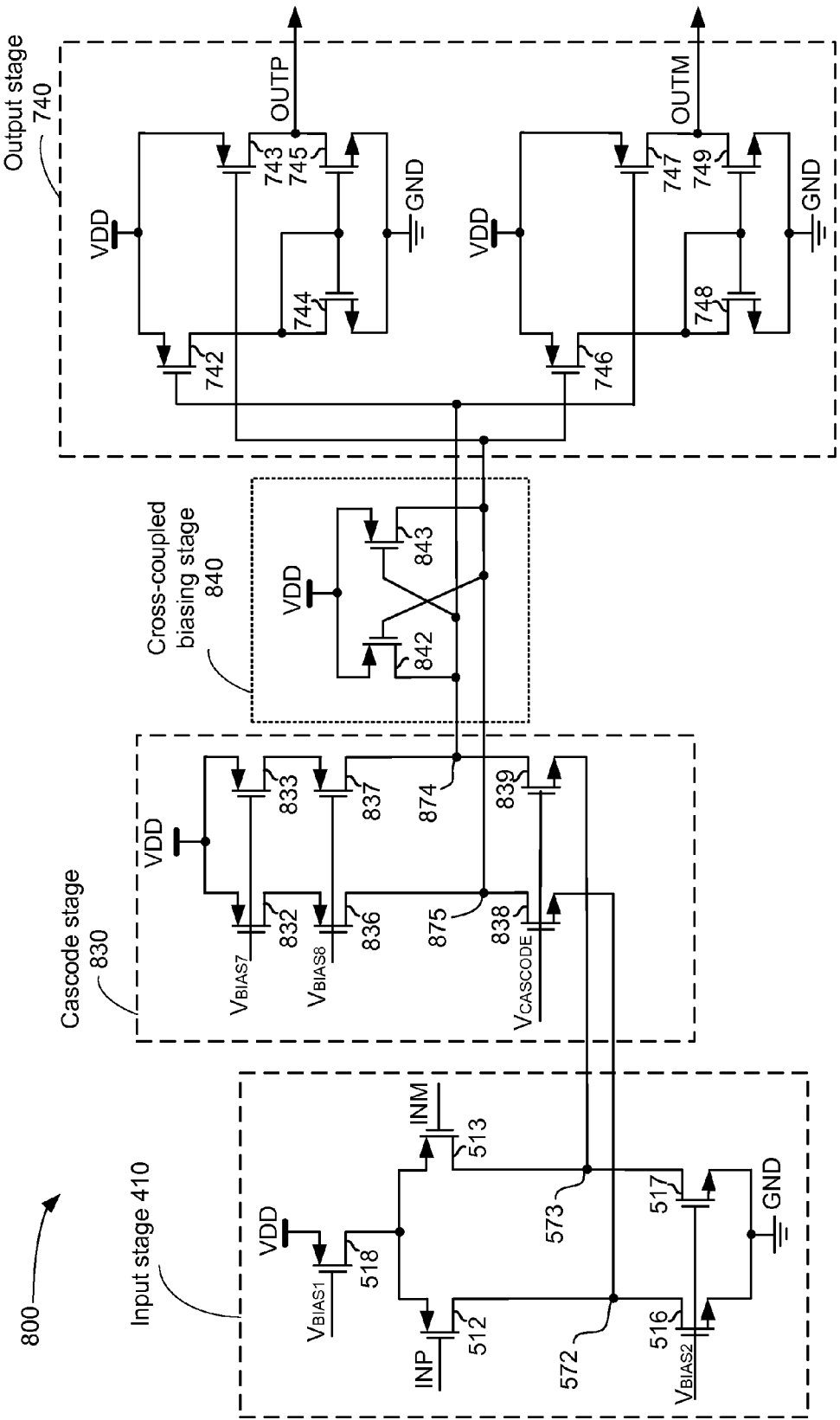
FIGS. 8A and 8B show an exemplary circuit diagram of a fourth embodiment of a class AB amplifier.
Figure 8B:
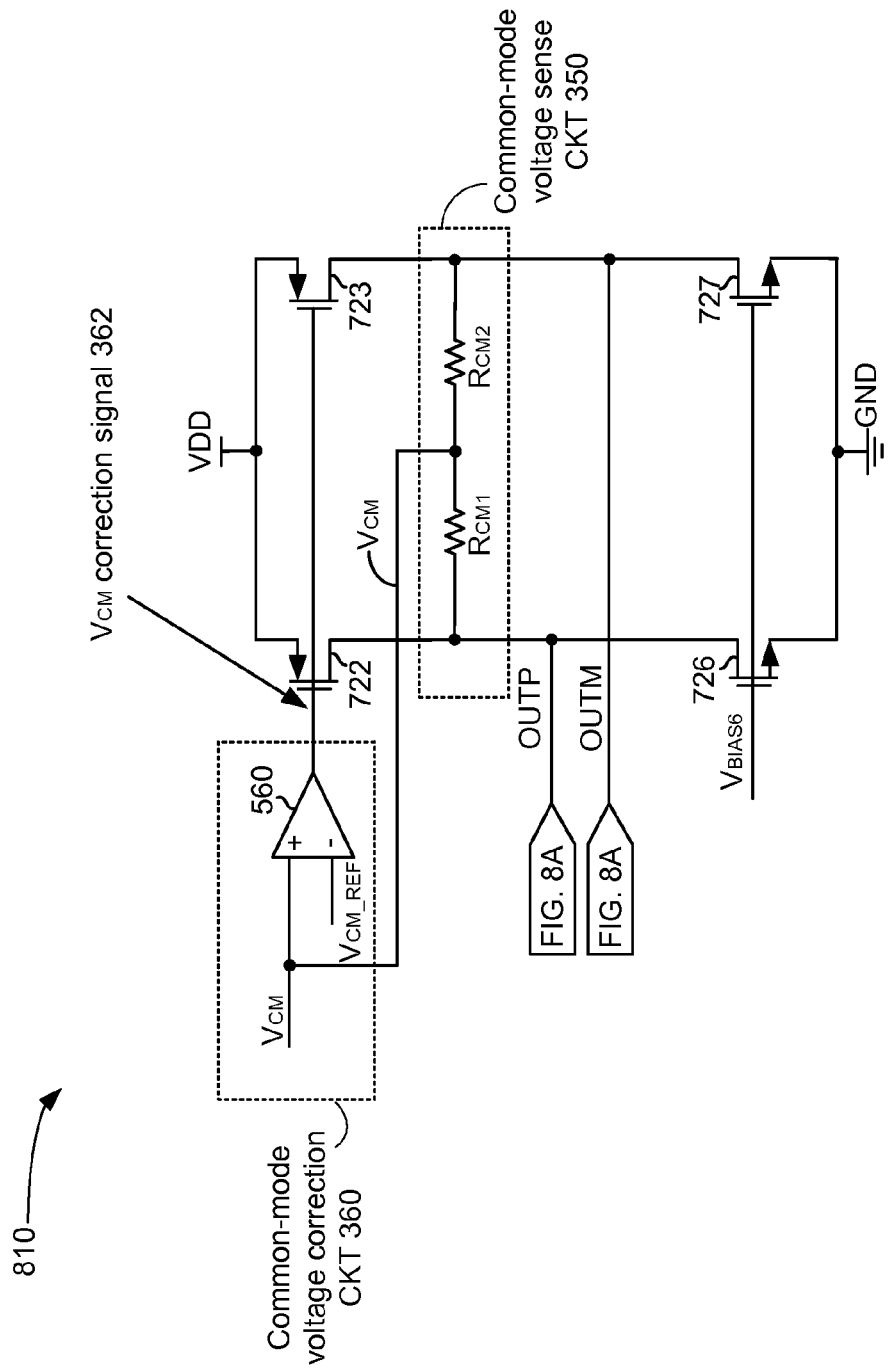

FIGS. 8A and 8B show an exemplary circuit diagram of a class AB amplifier 800 in accordance with a fourth embodiment. FIG. 8A is shown to include the input stage 410, a cascode stage 830, a cross-coupled biasing stage 840, and a class AB output stage 740 of the class AB amplifier 800. In some embodiments, the input stage 410 may be similar to the input stage 410 described above. Thus, input stage 410 may receive input signals INP and INM and generate output signals (e.g., currents) through nodes 572 and 573. The output currents may be coupled to the cascode stage 830.

The cascode stage 830 may be a folded cascode stage and may include PMOS transistors 832, 833, 836, and 837, and NMOS transistors 838 and 839. The PMOS transistors 832 and 833 may be configured as a common-source current source biased by a bias voltage $V_{BIAS7}$. The PMOS transistors 836 and 836 may be coupled to the PMOS transistors 832 and 833 and may be configured as a current source supplying current to nodes 874 and 875. The NMOS transistors 838 and 839 may be coupled to the nodes 874 and 875 and biased by the $V_{CASCODE}$ voltage. The NMOS transistors 838 and 839 may also be coupled to the 572 and 573 nodes and configured to receive current from the respective nodes. The PMOS transistors 832, 833, 836, and 837 may operate with the NMOS transistors 838 and 839 to amplify and buffer currents from the 572 and 573 nodes.

The cascode stage 830 may be coupled to the cross-coupled biasing stage 840 through the nodes 874 and 875. In some embodiments, the cross-coupled biasing stage 840 may balance, at least in part, currents provided through the 874 and 875 nodes. In some embodiments, the cross-coupled biasing stage 840 may include PMOS transistors 842 and 843 in a common-source configuration. A drain terminal of the PMOS transistor 842 may be coupled to the 874 node and a gate terminal of the PMOS transistor 842 may be coupled to the 875 node. In a similar manner, a drain terminal of the PMOS transistor 843 may be coupled to the 875 node and a gate terminal of the PMOS transistor 843 may be coupled to the 874 node. In this configuration, a voltage increase at a first node (e.g., the node 874 or the node 875) causes an increase in current in a second node (e.g. the node 875 or the node 874).

The class AB output stage 740 may be coupled to the cross-coupled biasing stage 840. In some embodiments, the class AB output stage 740 may be similar to the class AB output stage 740 described above with respect to FIG. 7A. Thus, the class AB output stage 740 may generate the output signal OUTP and the output signal OUTM. The class AB output stage 740 may be configured to receive signals from the nodes 874 and 875. The PMOS transistor 743 may operate as the pull-up circuit (e.g., similar to pull-up circuit 342 in FIG. 3). A current-mirror/sink including the NMOS transistors 744 and 745 may operate as the pull-down circuit (e.g., similar to pull-down circuit 344 in FIG. 3). The NMOS transistors 744 and 745 may be controlled by the PMOS transistor 742.

In a similar manner, the PMOS transistor 747 may operate as the pull-up circuit (e.g., similar to pull-up circuit 342 in FIG. 3). A current-mirror/sink including the NMOS transistors 748 and 749 may operate as the pull-down circuit (e.g., similar to pull-down circuit 344 in FIG. 3). The NMOS transistors 748 and 749 may be controlled by the PMOS transistor 746.

FIG. 8B illustrates a common-mode voltage control circuit 810 for the class AB amplifier 800. In some embodiments, the common-mode voltage control circuit 810 may be similar to the common-mode voltage control circuit 710 described above with respect to FIG. 7B. Thus, the common-mode voltage control circuit 810 may include the common-mode voltage correction circuit 360, the common-mode voltage sense circuit 350, the PMOS transistors 722 and 723, and the NMOS transistors 726 and 727. The common-mode voltage sense circuit 350 may sense the common-mode voltage $V_{CM}$ of the output signals OUTP and OUTM. The common-mode voltage correction circuit 360 may generate the VCM correction signal 362 based on the common-mode voltage $V_{CM}$ and the reference common-mode voltage $V_{CM-REF}$.

The NMOS transistors 726 and 727 and the PMOS transistors 722 and 723 may control the common-mode voltage $V_{CM}$ of the output signals OUTP and OUTM. In some embodiments, current through the PMOS transistors 722 and 723 may be controlled by the $V_{CM}$ correction signal 362. Current through the NMOS transistors 726 and 727 may be controlled by bias voltage $V_{BIAS6}$. Thus, currents through the PMOS transistors 722 and 723 may be varied in response to the common-mode voltage $V_{CM}$. Since the currents through the NMOS transistors 726 and 727 may remain relatively constant due to the $V_{BIAS6}$ voltage, changing the currents through the PMOS transistors 722 and 723 may control the common-mode voltage $V_{CM}$.

As will be understood by persons of ordinary skill in the art, various implementations of the scheme shown in FIGS. 8A and 8B are possible. For example, the cross-coupled biasing stage 840 may be implemented with NMOS transistors, NPN transistors, PNP transistors or any other technically feasible device.

Figure 9:
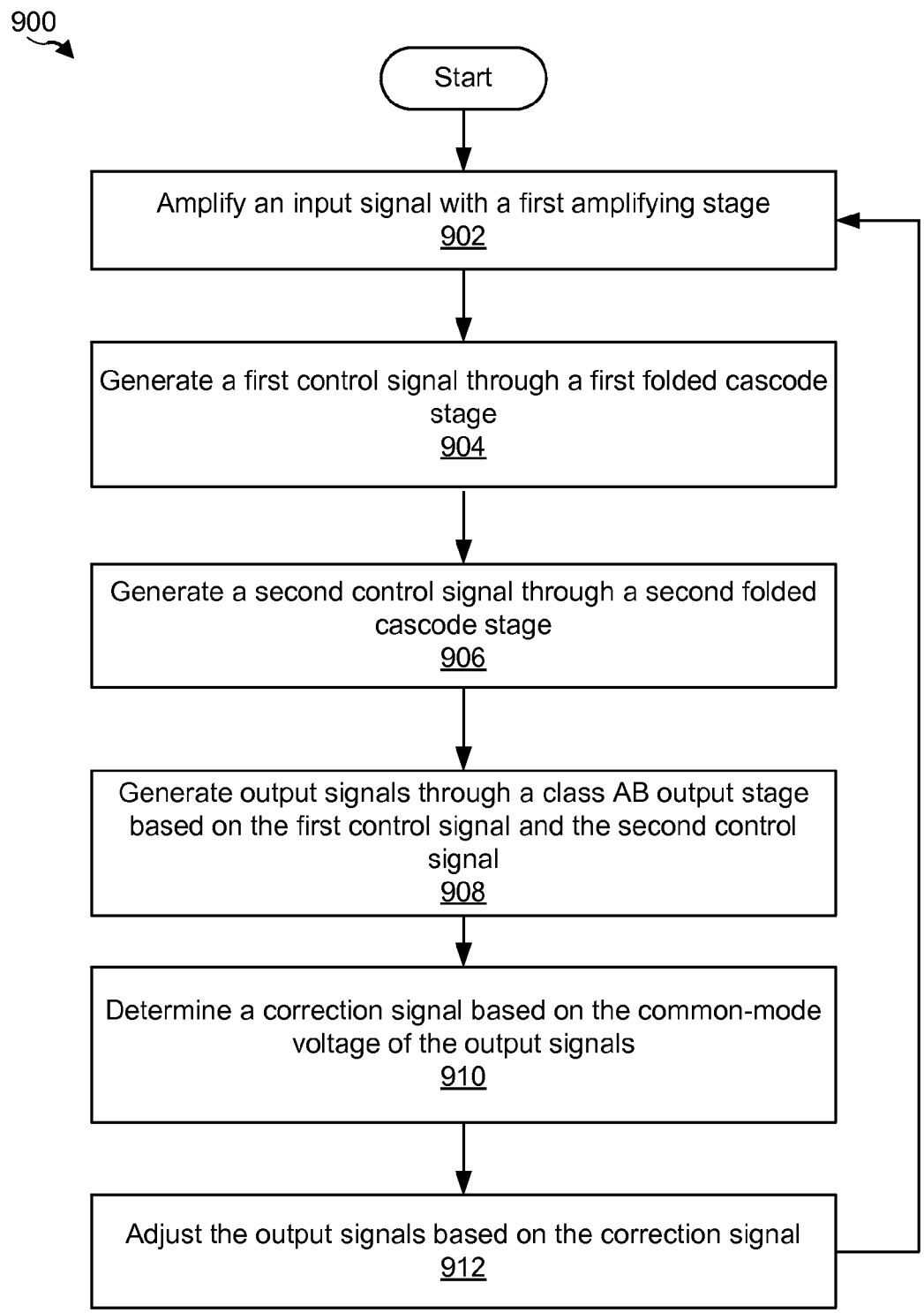
FIG. 9 shows an illustrative flow chart depicting an exemplary operation for operating class AB amplifiers in accordance with example embodiments.

FIG. 9 shows an illustrative flow chart depicting an exemplary operation 900 for operating an exemplary class AB amplifier, in accordance with example embodiments. Some embodiments may perform the operations described herein with additional operations, fewer operations, operations in a different order, operations in parallel, and/or some operations differently. Referring also to FIG. 4, an input signal is amplified by a first amplifying stage (902). In some embodiments, the first amplifying stage may be the input stage 410. Next, a first control signal is generated through a first folded cascode stage (904). In some embodiments, the first folded cascode stage may be the cascode stage 430, and the first control signal may be the pull-up control voltage 437 (e.g., and based on an output signal provided by the first amplifying stage to the first folded cascode stage).

Next, a second control signal is generated through a second folded cascode stage (906). In some embodiments, the second cascode stage may be the cascode stage 440, and may be coupled to the input stage 410 or to the input stage 420. The second control signal may be the pull-down control voltage 447 (e.g., and based on an output signal provided by the first amplifying stage to the second folded cascode stage). Persons of ordinary skill in the art will recognize that any technically feasible combination of input stages and folded cascode stages may be used to receive the input signal and generate the first and the second control signals. For example, the second control signal may be generated by the first cascode stage and the first control signal may be generated by the second cascode stage.

Next, output signals are generated through a class AB output stage based on the first control signal and the second control signal (908). In some embodiments, the class AB output stage may be the class AB output stage 340, the first control signal may be coupled to the pull-up circuit 342, and the second control signal may be coupled to the pull-down circuit 344. In other embodiments, the first control signal may be coupled to the pull-down circuit 344 and the second control signal may be coupled to the pull-up circuit 342. In some embodiments, the output signals may be the output signals OUTP and OUTM that together form the differential output signal 345.

Next, a correction signal is determined based on the common-mode voltage of the output signals (910). In some embodiments, the correction signal may be determined by the common-mode voltage correction circuit 360 and may be based on the reference common-mode voltage $V_{CM\_REF}$ and the common-mode voltage $V_{CM}$ of the output signals. Next, the output signals are adjusted based on the correction signal (912). In some embodiments, the correction signal may be received by the first folded cascode stage or the second folded cascode stage. In response to the correction signal, the first and/or second folded cascode stages may modify their associated control signals (e.g., the first control signal or the second control signal) to increase or decrease the common-mode voltage of the output signals. Flow proceeds to 902.

In the foregoing specification, the example embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An apparatus, comprising:
    a first folded cascode stage coupled to a first input stage and configured to generate a first control signal based on input signals received by the first input stage;
    a second folded cascode stage coupled to a second input stage and configured to generate a second control signal based on input signals received by the second input stage;
    a class AB output stage coupled to the first folded cascode stage and the second folded cascode stage, and configured to generate differential output signals based on the first control signal and the second control signal;
    a common-mode voltage correction circuit coupled to the second folded cascode stage comprising:
        a common-mode feedback amplifier configured to generate a correction signal to control a common-mode voltage of the differential output signals.

2. The apparatus of claim 1, the first folded cascode stage comprising:
    a self-biasing circuit configured to determine biasing currents for the first folded cascode stage.

3. The apparatus of claim 2, the self-biasing circuit comprising:
    a current source to supply current for the first folded cascode stage based on a common-mode voltage of the first folded cascode stage.

4. The apparatus of claim 3, the self-biasing circuit comprising:
    a voltage divider configured to determine the common-mode voltage of the first folded cascode stage.

5. The apparatus of claim 1, wherein the common-mode voltage correction circuit is configured to generate a correction signal in response to a common-mode voltage of the differential output signals.

6. The apparatus of claim 1, further comprising:
    a common-mode voltage sensing circuit coupled to the common-mode voltage correction circuit and configured to sense the common-mode voltage of the differential output signals.

7. The apparatus of claim 1, the class AB output stage comprising:
    a pull-up circuit to drive the differential output signals towards a power supply voltage in response to the first control signal; and
    a pull-down circuit to drive the differential output signals towards a ground voltage in response to the second control signal.

8. An apparatus comprising:
    means for generating a first control signal, via a first folded cascode stage, based on input signals received by a first input stage;
    means for generating a second control signal, via a second folded cascode stage, based on input signals received by a second input stage;
    means for generating differential output signals based on the first control signal and the second control signal;
    means for controlling a common-mode voltage of the differential output signals comprising:
        means for generating a correction signal in response to the common-mode voltage of the differential output signals.

9. The apparatus of claim 8, wherein the means for generating the first control signal is to determine biasing currents for the first folded cascode stage.

10. The apparatus of claim 9, further comprising:
    means for supplying current for the first folded cascode stage based on a common-mode voltage of the first folded cascode stage.

11. The apparatus of claim 10, further comprising:
    means for determining the common-mode voltage of the first folded cascode stage.

12. The apparatus of claim 8, further comprising:
    means for sensing the common-mode voltage of the differential output signals.

* * * * *